United States Patent [19]
Kaiser

[11] 4,070,516
[45] Jan. 24, 1978

[54] MULTILAYER MODULE HAVING OPTICAL CHANNELS THEREIN

[75] Inventor: Harold Dalton Kaiser, Poughkeepsie, N.Y.

[73] Assignee: International Business Machines Corporation, Armonk, N.Y.

[21] Appl. No.: 733,546

[22] Filed: Oct. 18, 1976

[51] Int. Cl.² ............................. B32B 3/10; G02B 5/14
[52] U.S. Cl. .................................. 428/137; 350/96 B; 350/96 WG; 428/210; 428/332; 428/428
[58] Field of Search ..................... 350/96 B, 96 WG; 428/137, 210, 332, 358, 167, 168, 172, 173, 427, 428, 901

[56] References Cited

U.S. PATENT DOCUMENTS

| | | | |
|---|---|---|---|
| 3,663,194 | 5/1972 | Greenstein et al. | 350/96 T |
| 3,716,804 | 2/1973 | Groschwitz | 350/96 WG |
| 3,785,717 | 1/1974 | Croset et al. | 350/96 WG |
| 3,817,730 | 6/1974 | Uchida | 350/96 WG |
| 3,879,606 | 4/1975 | Bean | 350/96 WG |

OTHER PUBLICATIONS

Freeman et al., "IBM Technical Disclosure Bulletin", vol. 17, #10, Mar. 1975, pp. 2902-2903.

*Primary Examiner*—William R. Dixon, Jr.
*Attorney, Agent, or Firm*—George O. Saile

[57] ABSTRACT

A method for manufacturing a multilayer ceramic module structure is described which includes a ceramic body having a plurality of continuous glass channels within the body. The module transmits signals from point to point on the module and to points off of the module by allowing the movement of optical pulses through optical channels rather than the conventional electrical pulses and metal wiring.

The method for fabricating the multilayer ceramic module includes providing a plurality of ceramic green sheets. The green sheets are then individually prepared for the circuit pattern plan for the module by opening via holes through certain locations of the various green sheets and forming grooves in other portions of the green sheets for a proper resulting pattern. A glass paste is applied to the green sheets to fill the grooves and the holes therein. The green sheets are then stacked and laminated by the use of suitable pressure. The laminated green sheets are then sintered to form a module package. During sintering, the ceramic fuses around the glass which also softens and fuses to form clear channels within the ceramic body. Glass must sinter fully at the sintering temperature of the ceramic without becoming so fluid that it would run out of the via and grooves into the interstices in the ceramic before the ceramic is fully sintered. This problem is overcome by selection of the ceramic and the glass so that the sintering temperature of the ceramic and the softening temperature of the glass paste are substantially the same.

8 Claims, 3 Drawing Figures

MULTILAYER MODULE HAVING OPTICAL CHANNELS THEREIN

BACKGROUND OF THE INVENTION

The invention relates to a method for forming multilayer ceramic modules or packages having optically transparent channels on several layers in the ceramic substrate and the resulting structure.

DESCRIPTION OF THE PRIOR ART

In microminiature electronic circuitry, it is desirable that a large number of integrated circuit chips be packaged and interconnected so that they can perform functions in the minimum of time. A major step in accomplishing some of these results is the multilayer ceramic technology. In this technology, uncured or "green" sheets of ceramic are metallized with noble or refractory metals. The metallized sheets are stacked, laminated and fired to form a monolithic ceramic-metal package. The ceramic package has a matrix of wiring in a three-dimensional form within its body. Semiconductor devices may now be positioned and physically and electrically attached to a surface of this package. A more complete description of the problems and advantages in this process is given in "A Fabrication Technique for Multilayer Ceramic Modules" by H. D. Kaiser et al., Solid State Technology May 1972, pp. 35–40.

There also has been work in the technology of optical transmission of light radiation fabricated in the form of sheets, strips and fiber forms. The material often used in glass or a related amorphous light conducting medium. The term often used for this type of structure is optical waveguides. Examples of this technology in the literature are "Integrated Optics: An Introduction," by S. E. Miller, The Bell System Technical Journal, Volume 48, Sept. 1969, No. 7, pp. 2059, 2067 and "A Survey of Integrated Optics" by S. E. Miller, IEEE Journal of Quantum Electronics, Vol. QE-8, No. 2, Feb. 1972, pp. 199—205. Examples of patents issued to various structures and methods for forming optical waveguides are U.S. Pat. Nos. 3,785,717 to Croset et al; 3,806,223 to D. K. Keck et al.; 3,817,730 to T. Uchida; 3,825,318 to Croset et al.; 3,873,339 to M. C. Hudson; 3,879,606 to K. E. Bean; and 3,903,488 to T. T. Fong.

A multilayer opto-electronic module structure was developed by B. Greenstein et al. in U.S. Pat. No. 3,663,194 which patent is assigned to the assignee of the present patent application. This module structure include the matrix of optical transmitting regions and optical isolating layers of the regions. The structure is formed by alternating layers of optically transmitting and optically isolating materials onto a substrate and then onto each other. Defined patterns of optical isolators are formed transversely on the layers within the transmitting material to form the plural light conducting channels. The optical transmitting material is typically glass. The glass is deposited in the form of a suspension in the liquid onto the substrate to its desired thickness. The glass is then fired to form a continuous glass layer. The optically isolating layer which is highly reflective and may be metallic is deposited thereon. The structure is then built up in such a manner.

SUMMARY OF THE PRESENT INVENTION

In accordance with the present invention, a multilayer substrate is structured that transmits signals from point-to-point within the substrate and to points off the substrate by using optical pulses and channels rather than the electrical pulses and metal wiring of the prior art. This type of substrate will be formed into a module for carrying semiconductor devices which has several advantages over conventional multilayer ceramic modules having electrical wiring. The wide band width capabilities of optical channels would allow the substrate to handle a great deal more information than the conventional multilayer ceramic module. Also the signal propagation is substantially faster in optical pulsing than in electrical pulsing. There is virtually no crosstalk and other interchannel interferences between optical channels as compared to the conventional electrical wiring. The optical channels can therefore be placed much closer to one another and run parallel. The channels, made of glass or similar dielectrical materials, are not susceptible to corrosion and electromigration as are the electrical conductive lines.

The method of manufacturing the multilayer ceramic module structure having optical channels involves providing a plurality of ceramic green sheets. Holes are punched in certain of the green sheets and glass paste is applied to the green sheets in the desired optical channel pattern and into the via holes in certain of the green sheets. The sheets are then stacked, laminated and sintered to form the individual green sheets into a package. During the sintering the ceramic fuses around the glass which in turn fuses to form clear optical channels. The method has the advantage of forming the optical channels in the substrate simultaneously with the sintering of the ceramic. This is accomplished by choosing the ceramic and glass materials to have closely related sintering and softening temperatures together with index of refraction characteristics. The present process has substantial advantages in the time required to form the substrate over prior art procedures which require individual glass layer formation as a sequential process.

DESCRIPTION OF THE PREFERRED EMBODIMENTS

Figure 1:
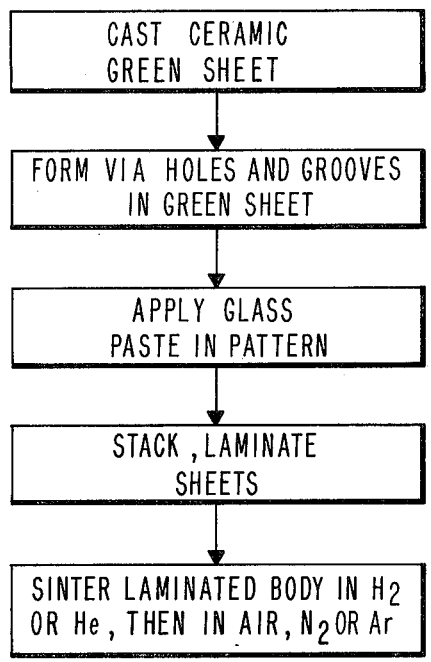
FIG. 1 is a flow chart illustrating the present invention.

Referring now more particularly to FIG. 1, the method for forming the multilayer module of the present invention may be more fully understood. The ceramic green sheet is formed by weighing out the proper portions of the ceramic powder and glass frit or glass forming materials, and blending the particles by ball or other milling techniques. The organic binder comprising the thermoplastic resin, plasticizer and solvents is then mixed and blended with the ceramic and glass powders on a ball mill. A slurry or slip is cast into a tape form by extruding or doctorblading. The cast sheet is then allowed to be dried of the solvent constituent in the binder system. After the tape is completely dried, it is then cut into working blanks or sheets; registration holes are formed in the blanks together with via holes which are selectively punched into the working sheets. The holes can be made by mechanical punching, electron-beam or laser machining. Also provided into the green sheets are grooves into which subsequently will be applied the glass paste. These grooves are formed by electron-beam, laser machining or by incusing. The general process for forming ceramic green sheets may be understood in more detail by reference to the aforementioned paper by H. D. Kaiser et al. and to the Park U.S. Pat. No. 2,966,719.

The glass or similar dielectric material paste is formed by mixing the particles having a particle size of between about 0.1 microns to 2 with suitable other materials such as organic resins, and solvents. Typical resins are ethyl cellulose or α methyl styrene. Typical solvents are butyl carbitol acetate or terpineol. A suitable formulation would be about 80% (by wt.) glass powder, 6% resin and 14% solvent. These would be mixed together in a mullite or alumina mortar and pestle until a smooth, uniform paste results. A three-roll mill with alumina coated rolls would also be suitable for paste formation.

The glass paste then is applied into the grooves and into the via holes in the ceramic blanks by wiping, extrusion or similar techniques. The paste is then dried by subjecting the blanks to temperatures of 80°–100° C for 1–2 hours in a circulating air oven until the solvent is essentially removed.

The ceramic blanks are stacked in proper sequence. The stack may be carefully registered using registration pins so that the channels from layer to layer are properly registered and aligned. The registered stack of green ceramic sheets is then placed in a laminating press. Moderate heat and pressure is applied. The preferred pressure and temperature for this operation is 1000–1500 psi and 35°–45° C for 5–15 minutes.

In the laminating step, the thermoplastic binder in the green ceramic sheets softens and the layers fuse together, deforming around the glass channels to completely enclose these channels. The result is that the unfired stack will show no signs of individual layers. The stack of green sheets is then sawed or punched to the size of the finished module plus an allowance for shrinkage.

The green module is then fired or sintered in a suitable furnace wherein the sintering is largely carried out in a gas of small atomic or molecular size such as hydrogen or helium followed by the completion of sintering of the glass and ceramic in an atmosphere of air, nitrogen, argon or the like. Nitrogen or argon is typically used after an initial hydrogen sinter for safety reasons.

The time required to complete this sintering operation varies and is dependent on such factors as the particle size distribution of the glass and ceramic, the relationship of the soak temperature to the softening temperature of the glass, the sintering kinetics of the ceramic and the atmosphere used. A typical cycle which could be used with the materials in Example 1 would be: Increase the temperature from room temperature to the soak temperature (800° C) at the rate of about 300°–400° C/hour. Soak in hydrogen or helium for 1–2 hours, then switch to nitrogen, argon or air and soak for an additional 1–2 hours. Lower the temperature to about 100° C at a rate of 50°–100° C/hour to prevent stressing.

The purpose of the use of a gas of small atomic or molecular size is to essentially eliminate bubbles in the glass or other dielectric channels. This happens in the following manner: Sintering is done almost to completion in the gas of small atomic or molecular size, i.e., helium or hydrogen. The structure now consists of fused or sintered glass and ceramic with gas dissolved in it and also closed pores filled with gas. At this point the furnace atmosphere is switched to a gas of larger molecular diameter such as nitrogen, argon, etc. This results in a reduction of the partial pressure outside the substrate of the initial gas ($He, H_2$) to essentially zero and promote the diffusion of these gases out of the substrate. This is because the gases are small and diffuse readily. At the same time, the gases, i.e., $N_2$, Ar, which now compose the furnace atmosphere are too large to diffuse to any extent into the essentially sintered substrate. As a result, the substrate becomes gas-free and the closed pores shrink and disappear, leaving bubble-free glass channels.

It may be desirable in many cases to also have conductive metal lines within the ceramic multilayer module. These conductive layers can be used as ground and voltage sources for semiconductor chips which may be carried on the module. The conductive lines may be formed by providing suitable metallizing conductive pastes. These conductive pastes essentially consist of a metal powder, an organic resin and a solvent. The metal powder used depends on the sintering temperature and atmosphere. It must have a melting point above the sintering temperature and be able to retain its metallic character in the atmosphere used. For example, for a system sintered at 800° C in a reducing atmosphere either gold or copper would be suitable. Typical resins used are ethyl cellulose or methyl styrene and typical solvents are butyl carbitol acetate or terpineol. The formulation of conductive pastes has been discussed extensively in L. F. Miller "Thick Film Technology" Gordon and Breach 1972.

The paste may be screen onto the particular ceramic green sheets of the stack and into the desired via holes to provide the desired pattern of lines from the top surface of the substrate to the bottom surface of the substrate. The conductive paste may also be fired simultaneously with the ceramic and the glass paste.

Subsequent to sintering, any further treatments required such as electroless or electroplating, pinbrazing and so forth which are necessary to make the substrate suitable for semiconductor chip joining or joining of the resulting module to a card or board or other substrate is done. Semiconductor chips can now be joined to the substrate by the usual conventional techniques. A particularly suitable technique is the flip-chip solder reflow joining technique which is fully described in the L. F. Miller U.S. Pat. No. 3,429,040 assigned to the assignee of the present patent application.

Figure 2:
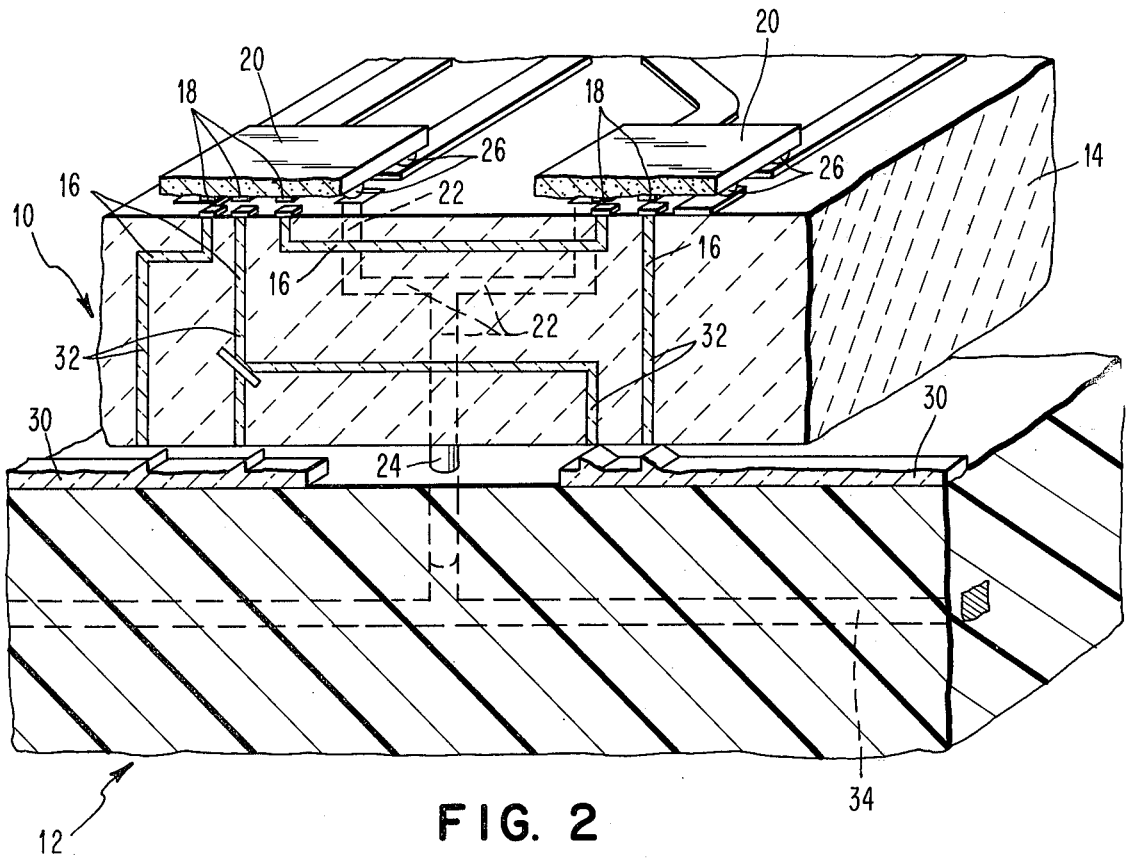
FIG. 2 illustrates the module of the present invention having semiconductor chips mounted thereon and itself supported on a substrate.

FIG. 2 shows the cross-sectional view of a module 10 of the present invention which is carried on a substrate or circuit board 12. There is shown a ceramic substrate 14 which has glass or other dielectric channels 16 therein. The channels 16 convey optical signals or pulses from optical emitter or detector beams 18 within the semiconductor chip 20. The module contains metal lines 22 which are used to convey electrical power from the input pins or studs 24 to the power inputs 26 to the semiconductor chips. These power inputs can also be used to support and/or align the module 10 to the circuit board 12 for the chips 20 to the module 10.

The substrate or board 12 contains glass or plastic optical lines 30 to transmit and receive optical signals from the module input or outputs 32. The substrate 12 also could contain power planes 34 to convey power through the pins 24 to the module 10.

Figure 3:
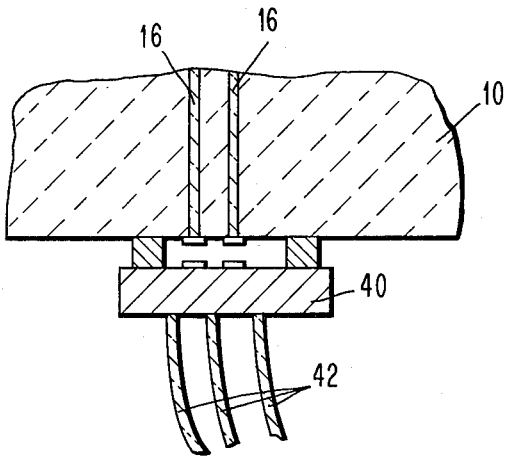
FIG. 3 illustrates a method of conveying signals to and from the module of the present invention.

Another method conveying signals to and from the module 10 yet is shown in FIG. 3. The signals are typically brought to the exterior of the module 10 by glass channels 16. The optical signals are then picked up by a detector array structure 40 and transmitted therefrom by optical cable 42. The detector array can either be passive or active. The distinction between passive and active is that in the case of an active detector array, the signal would be amplified prior to passing it to the optical cables. Optical signals can also be moved into the module through this detector array.

The semiconductor device chips 20 used are special chips which not only perform electrically the needed logic or memory functions, but are able to convert the incoming optical signals (either discrete or continuous) to electrical signals or, conversely, convert the outgoing electrical signals to opticals signals. This is accomplished by arrays of LED's or laser and photodiodes on the side of the chip which faces the substrate. The chips can be joined to the substrate using the metal power input studs and conventional controlled collapse chip joining methods.

There are many combinations of materials which can be used to make a module with optical waveguides. The criteria for selection are: (1) In the green sheet stage, the ceramic, which may be either crystalline or amorphous, for example a glass, must be capable of being machined or incused with smooth, sharply defined channels. This can be accomplished more readily if the particle size of the ceramic or glass powder used for the substrate is small. (2) The glass for the waveguides must fuse into bubble and defect free "wires". This can be accomplished by following the criteria and methods discussed above under sintering. (3) The refractor index of the waveguide material must be greater than that of the ceramic or glass substrate. The glass composition is generally not important to the process, just the softening point and refractive index.

Several examples of substrate-waveguide material combinations, using both ceramic and glass substrates are included hereafter merely to aid in the understanding of the invention and variations may be made by one skilled in the art without departing from the spirit and scope of the invention.

EXAMPLE 1

Ceramic Substrate Material
80% Ecutyptite
20% Borosilicate Glass
  70% $SiO_2$
  28% $B_2O_3$
  1.0% $Li_2O$
  1.0% $Al_2O_3$
Sintering Temperature (S.T.) — 805° C.
Index of Refraction ($n$) — 1.52
Waveguide Material
Potash Lead Glass (Corning Glass 8161)
Softening Point (S.P.) — 600° C.
Index of Refraction ($n$) — 1.66

EXAMPLE 2

Ceramic Substrate Material
45% Anorthite
55% Borosilicate Glass
  70% $SiO_2$
  28% $B_2O_3$
  1.0% $Li_2O$
  1.0% $Al_2O_3$
Sintering Temperature (S.T.) — 800° C.
Index of Refraction ($n$) — 1.52
Waveguide Material
Potash Lead Glass (G.E. 138 Glass)
Softening Point (S.P.) — 665° C. $n$ — 1.58

EXAMPLE 3

Glass Substrate Material
Fused Silica
  S. T. — 1585° C.
  $n$ — 1.46
Waveguide Material
Titanium Silicate (Amorphous)
  S. P. — 1490
  $n$ — 1.48

EXAMPLE 4

Glass Substrate Material
Alkali Zinc Borosilicate Glass (Corning 0211 Glass)
  S. P. — 720° C.
  $n$ — 1.53
Waveguide
Potash Lead Glass (Corning 8161 Glass)
  S. P. — 600° C.
  $n$ — 1.66

In the case of the glass substrate-glass waveguide combinations, there will be some interdiffusion of the glasses during sintering, resulting in a gradient of refractive indices between substrates and waveguide. This is not detrimental and in fact may be beneficial.

While the invention has been particularly described with reference to the preferred embodiments thereof, it will be understood by those skilled in the art that the foregoing and other changes in form and details may be made therein without departing from the spirit and scope of the invention.

What is claimed is:

1. A multilayer ceramic module structure comprising:
a ceramic body;
a plurality of continuous glass channels within said body and having their ends at two surfaces of said body;
wherein said glass has a softening point about equal to or less than the said ceramic body's sintering temperature; and
said glass has a refractive index greater than the said ceramic.

2. The structure of claim 1 wherein said channels have a cross-section between about 0.001 in.$^2$ and 0.005 in.$^2$.

3. The structure of claim 1 wherein said ceramic is a mixture of ecutyptite and borosilicate glass, and said glass channel is a potash lead glass.

4. The structure of claim 1 wherein said ceramic is a mixture of anorthite and borosilicate glass and said glass channel is a potash lead barium glass.

5. The structure of claim 1 wherein said ceramic is fused silica and the said glass channel is amorphous titanium silicate.

6. The structure of claim 1 wherein a semiconductor chip is physically attached to said structure and means are provided in said chip to optically communicate with said glass channels.

7. A multilayer ceramic module structure comprising a ceramic body;
a plurality of continuous glass channels within said body and having their ends at two surfaces of said body;

wherein said glass has a refractive index greater than the said ceramic; and said glass has a softening point about equal to or less than the said ceramic body's sintering temperature;

means provided for physically supporting said module; and means to optically communicate with said glass channels.

8. The multilayer ceramic module of claim 7 wherein said means to optically communicate with said glass channels are provided in said means for physically supporting said module.

* * * * *